(12) United States Patent
Koike et al.

(10) Patent No.: US 6,800,135 B2
(45) Date of Patent: Oct. 5, 2004

(54) ZNO/SAPPHIRE SUBSTRATE AND METHOD FOR MANUFACTURING THE SAME

(75) Inventors: Jun Koike, Kanazawa (JP); Hideharu Ieki, Kanazawa (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 109 days.

(21) Appl. No.: 10/171,631

(22) Filed: Jun. 17, 2002

(65) Prior Publication Data

US 2003/0005878 A1 Jan. 9, 2003

(30) Foreign Application Priority Data

Jun. 15, 2001 (JP) ........................................ 2001-182130
Apr. 30, 2002 (JP) ........................................ 2002-128757

(51) Int. Cl.$^7$ .......................... C30B 23/02; C30B 25/18; C01B 13/00
(52) U.S. Cl. .......................... 117/101; 117/84; 117/88; 117/92; 117/103; 117/108; 117/902; 117/944; 117/956; 423/579; 423/594.14; 423/622
(58) Field of Search .............................. 117/101, 84, 88, 117/92, 103, 108, 902, 944, 956; 423/579, 594.14, 622

(56) References Cited

U.S. PATENT DOCUMENTS

| | | | | |
|---|---|---|---|---|
| 4,623,426 A | * | 11/1986 | Peters | ........................ 117/99 |
| 5,432,397 A | * | 7/1995 | Koike et al. | ................. 310/358 |
| 5,569,548 A | * | 10/1996 | Koike et al. | ................. 428/699 |
| 6,366,389 B1 | * | 4/2002 | Wraback et al. | ............. 359/244 |

OTHER PUBLICATIONS

Shiosaki et al, "High Rate Epitaxial Growth of ZnO Films on Sapphire by Planar Magnetron rf Sputtering System", (1978), Journal of Crystal Growth, 45, pp. 346–349.*

Kadota et al, "Piezoelectric Properties of ZnO films on a Sapphire substrate deposited by an RF–Magnetron–Mode ECR Sputtering System", (1998), Jpn, J. Appl. Phys., vol. 37, pp. 2923–2926.*

Kim et al, "Epitaxial growth of ZnO films on R–plane sapphire substrate by radio frequency magnetron sputtering", (1997), J. Vac. Sci. Technol. A 15 (3), pp. 1103–1107.*

High Rate Epitaxial Growth of ZnO Films on Sapphire By Planar Magnetron rf Sputtering System; Journal of Crystal Growth, vol. 45, Dec. 1978.

* cited by examiner

*Primary Examiner*—Nadine G. Norton
*Assistant Examiner*—Matthew Song
(74) *Attorney, Agent, or Firm*—Dickstein, Shapiro, Morin & Oshinsky, LLP.

(57) ABSTRACT

A ZnO/sapphire substrate includes an R-plane sapphire substrate whose (0 1–1 2) planes are parallel to the surface thereof and a ZnO epitaxial film formed on the R-plane sapphire substrate. The (1 1–2 0) planes of the ZnO epitaxial film are disposed with an interplanar spacing in the range of about 1.623 to 1.627 Å parallel to the (0 1–1 2) planes of the R-plane sapphire substrate.

4 Claims, 5 Drawing Sheets

ZNO/SAPPHIRE SUBSTRATE AND METHOD FOR MANUFACTURING THE SAME

BACKGROUND OF THE INVENTION

1. Field of the Invention

The present invention relates to ZnO/sapphire substrates used for surface acoustic wave devices, various optical devices, semiconductor devices, and the like. In particular, the present invention relates to a ZnO/sapphire substrate in which a (1 1–2 0) ZnO film is deposited on an R-plane sapphire substrate whose (0 1–1 2) planes are parallel to the surface thereof and to a method for manufacturing the substrate.

2. Description of the Related Art

Various piezoelectric materials are used as substrates of surface acoustic wave devices and the like. A paper in the Journal of Crystal Growth 45 (1978), 346–349 discloses a structure in which (1 1–2 0) planes of a ZnO single-crystal film are disposed on the (0 1–1 2) planes of a sapphire substrate by magnetron sputtering.

The R-plane sapphire readily allows a ZnO single-crystal film to epitaxially grow thereon under conditions which are not strict. However, the inventors found that when (1 1–2 0) planes of ZnO are epitaxially disposed to form a ZnO film on the R-plane sapphire, a residual stress occurs in the ZnO film and it often causes cracks in the ZnO film.

SUMMARY OF THE INVENTION

Accordingly, an object of the resent invention is to provide a high-quality ZnO/sapphire substrate in which ZnO (1 1–2 0) planes are disposed to form a ZnO film on an R-plane sapphire substrate whose (0 1–1 2) planes are parallel to the surface thereof. The ZnO/sapphire substrate does not exhibit cracks, and is therefore capable of being used for various devices. Also, an object of the present invention is to provide a method for manufacturing the ZnO/sapphire substrate.

The inventors have been considered that the residual stress in the ZnO film, which is caused by a mismatch between the lattice constants of ZnO crystals and sapphire crystals, causes cracks in the ZnO film, and have conducted intensive research to accomplish the objects.

According to one aspect of the present invention, there is provided a ZnO/sapphire substrate comprising an R-plane sapphire substrate whose (0 1–1 2) crystal planes are parallel to the surface thereof and a ZnO epitaxial film formed on the R-plane sapphire substrate. The (1 1–2 0) crystal planes of the ZnO epitaxial film are parallel to the (0 1–1 2) crystal planes of the R-plane sapphire substrate, and an interplanar spacing of (1 1–2 0) crystal planes of the ZnO epitaxial film is set in a range of about 1.623 Å to 1.627 Å.

According to another aspect of the present invention, a method for manufacturing a ZnO/sapphire substrate is provided. The method comprises the steps of: preparing an R-plane sapphire substrate whose (0 1–1 2) crystal planes are parallel to the surface thereof; and epitaxially growing a ZnO film on the R-plane sapphire substrate such that (1 1–2 0) crystal planes of the ZnO epitaxial film are parallel to the (0 1–1 2) crystal planes of the R-plane sapphire substrate, and setting the interplanar spacing of (1 1–2 0) crystal planes of the ZnO epitaxial film in a range of about 1.623 Å to 1.627 Å.

The present invention is also directed to a surface acoustic wave device comprising the ZnO/sapphire substrate and an interdigital transducer formed on the ZnO/sapphire substrate.

DESCRIPTION OF THE PREFERRED EMBODIMENTS

Embodiments will now be described with reference to the drawings.

In order to epitaxially grow a ZnO film, on an R-plane sapphire substrate whose (0 1–1 2) planes are parallel to the surface thereof, such that the (1 1–2 0) planes of the ZnO film are disposed parallel to the (0 1–1 2) planes of the sapphire substrate, various kinds of sputtering, CVD, chemical transporting and the like methods, are used. In particular, RF magnetron sputtering makes it possible to epitaxially form a high-quality ZnO film at a low temperature. A process for epitaxially growing a ZnO film by RF magnetron sputtering will be described in the following. However, the other methods described above may be used.

Figure 3:
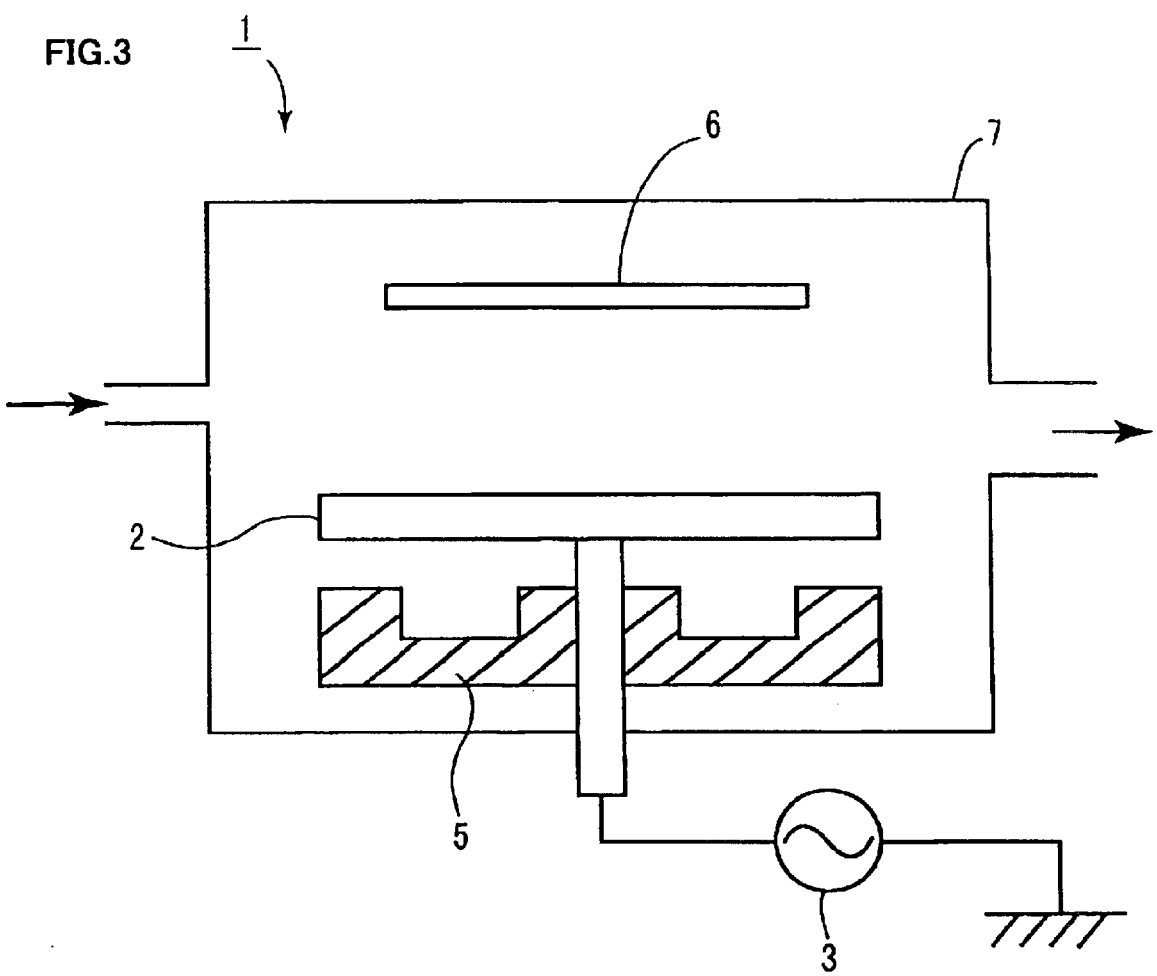
FIG. 3 is a schematic view of an RF magnetron sputtering apparatus for forming a ZnO film in an example of the present invention.

In this embodiment, an RF magnetron sputtering apparatus 1 shown in FIG. 3 is used. A Zn target 2 of the RF magnetron sputtering apparatus 1 is connected to a high-frequency power supply 3. A magnet 5 is located under the Zn target 2. An R-plane sapphire substrate 6 is disposed opposite the Zn target 2. A mixture of Ar and $O_2$ gasses is introduced into a sputtering chamber 7. The gas in the chamber 7 is discharged by a pump.

When RF magnetron sputtering is performed, Ar ions strike the Zn target 2 to produce Zn particles from the Zn target 2. The Zn particles react with the $O_2$ gas to produce ZnO, and thus ZnO is deposited on the R-plane sapphire substrate 6.

Figure 1:
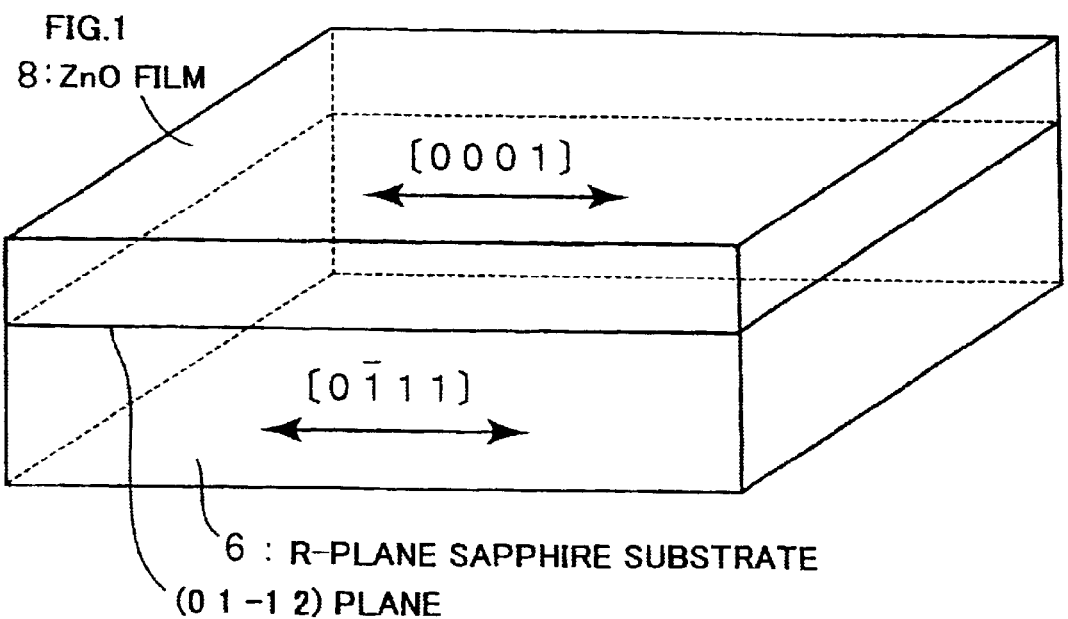
FIG. 1 is a schematic perspective view of a ZnO/sapphire substrate of the present invention.

By selecting the sputtering conditions, such as the RF power, evacuation conductance and gas pressure, a ZnO film 8 is epitaxially grown on the R-plane sapphire substrate 6, as shown in FIG. 1. When the R-plane sapphire substrate 6 has (0 1–1 2) planes parallel to the surface thereof, the ZnO film 8 is epitaxially grown such that (1 1–2 0) planes of the ZnO are disposed parallel to the (0 1–1 2) planes of the sapphire substrate.

In this instance, the ZnO film 8 and the R-plane sapphire substrate 6 exhibit a relationship in which (1 1–2 0) planes of the ZnO are parallel to the (0 1–1 2) planes of the sapphire and the [0 0 0 1] direction of the ZnO is parallel to the [0–1 1 1] direction of the sapphire, as shown in FIG. 1.

The conditions for the epitaxial growth of the ZnO film may allow a certain range of choice. However, cracks are often found, by optical microscopy, in ZnO films formed according to the above-described process.

The inventors analyzed crystals of ZnO films formed under various conditions by X-ray diffraction and observed cracks in the Zn films by optical microscopy. The results are shown in Table 1.

Figure 4:
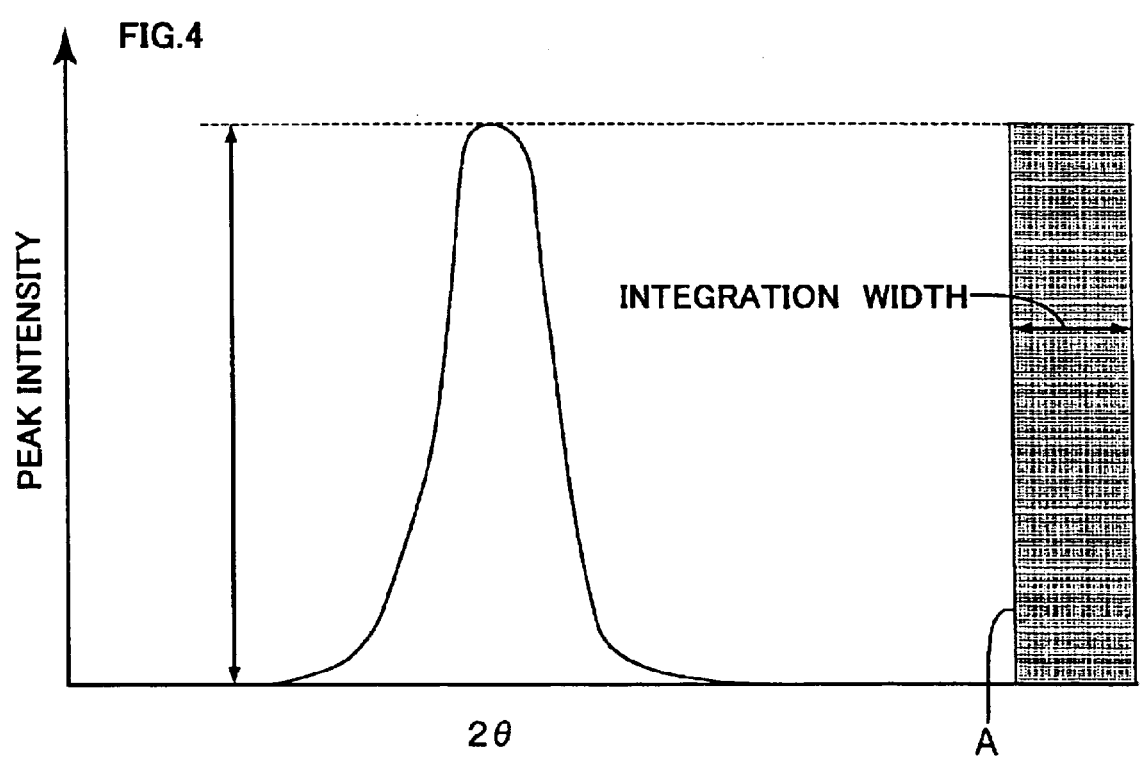
FIG. 4 is a drawing showing the relationship between an X-ray diffraction peak and the integration width.

The integration widths shown in Table 1 represent the following. An exemplary X-ray diffraction peak of the (1 1–2 0) planes of the ZnO films is shown in FIG. 4. The horizontal axis of FIG. 4 represents the diffraction angle 2θ and the vertical axis represents the strength of the diffraction peak. A high, sharp peak means excellent crystallinity. The integration width represents the sharpness of the peak. Specifically, as shown in FIG. 4, the integration width represents the width of a rectangle A having the same height and area as those of the diffraction peak.

The sharper is the peak, the smaller is the integration width. Hence, a small integration width means excellent crystallinity.

Table 1 also shows the interplanar spacing d of the ZnO (1 1–2 0) crystal planes.

TABLE

| RF power (kW) | Orifice conductance (%) | Gas pressure (Pa) | Substrate temperature (° C.) | Crack | 2θ value | Integration width | Interplanar spacing d (Å) |
|---|---|---|---|---|---|---|---|
| 3.5 | 90 | 0.59 | 260 | ○ | 56.523 | 0.385 | 1.62678 |
| 3 | 70 | 0.53 | 260 | ○ | 56.557 | 0.387 | 1.62574 |
| 3.5 | 80 | 0.59 | 280 | ○ | 56.573 | 0.388 | 1.62548 |
| 3 | 90 | 0.59 | 280 | ○ | 56.604 | 0.385 | 1.6247 |
| 3 | 80 | 0.59 | 280 | ○ | 56.607 | 0.386 | 1.62444 |
| 3 | 60 | 0.53 | 260 | ○ | 56.636 | 0.369 | 1.62366 |
| 3 | 60 | 0.60 | 260 | ○ | 56.658 | 0.387 | 1.62314 |
| 3 | 70 | 0.60 | 260 | ○ | 56.674 | 0.388 | 1.62288 |
| 3 | 50 | 0.60 | 260 | Δ | 56.676 | 0.379 | 1.62262 |
| 2.5 | 60 | 0.53 | 260 | Δ | 56.676 | 0.46 | 1.62262 |
| 2.5 | 70 | 0.53 | 260 | Δ | 56.698 | 0.382 | 1.6221 |
| 2.5 | 50 | 0.60 | 260 | Δ | 56.72 | 0.42 | 1.62158 |
| 2.5 | 60 | 0.60 | 260 | Δ | 56.722 | 0.403 | 1.62158 |
| 2.5 | 60 | 0.73 | 230 | Δ | 56.725 | 0.524 | 1.62132 |
| 2.5 | 50 | 0.53 | 260 | X | 56.73 | 0.39 | 1.62132 |
| 2.5 | 70 | 0.60 | 260 | Δ | 56.735 | 0.378 | 1.62106 |
| 2.5 | 50 | 0.73 | 230 | X | 56.78 | 0.735 | 1.62002 |
| 2.5 | 60 | 0.73 | 260 | Δ | 56.788 | 0.471 | 1.61976 |
| 2 | 60 | 0.73 | 230 | X | 56.792 | 0.575 | 1.61976 |
| 2 | 50 | 0.73 | 260 | X | 56.823 | 0.515 | 1.61896 |
| 2.5 | 50 | 0.73 | 260 | X | 56.826 | 0.478 | 1.61869 |
| 2 | 60 | 0.73 | 260 | X | 56.841 | 0.625 | 1.61842 |

In the Table, ○: no cracks Δ: few cracks x: many cracks; and orifice conductance represents the ratio of the evacuation opening area adjusted by an orifice to the original evacuation opening area of the sputtering apparatus.

Figure 2:
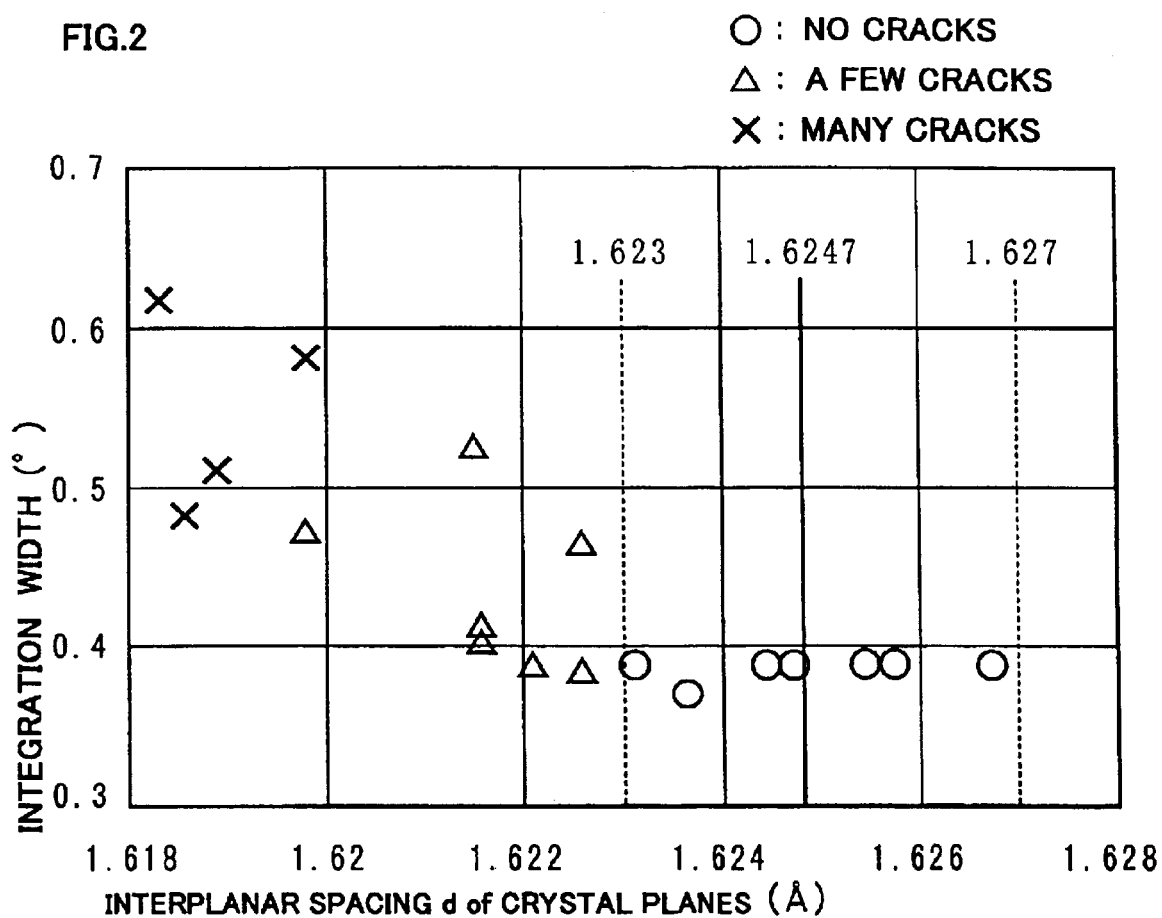
FIG. 2 is a graph showing the relationship between the interplanar spacing d of the (1 1–2 0) planes of a ZnO epitaxial film, the integration width of an X-ray diffraction peak, and the occurrence of cracks in the ZnO epitaxial film.

FIG. 2 shows the relationship between the interplanar spacing d of the (1 1–2 0) planes of the ZnO films in Table 1, the integration width and the state of cracks.

When an epitaxial film is formed on a substrate using materials different from each other, a mismatch between the lattice constants of the materials causes stress in the epitaxial film. Also, when the film is formed at a high temperature, the difference between the expansion coefficients of the materials causes stress in the epitaxial film. If stress remains in the completed epitaxial film, the interplanar spacing between the crystal planes of the epitaxial film varies in comparison with when the film does not have stress. The degree of variation of the interplanar spacing depends on the amount of stress and the type of stress, that is, whether it is tensile stress or compressive stress. An increased stress results in a larger interplanar spacing d between the crystal planes than when the film does not have stress. When the amount of stress becomes larger than a certain value, the epitaxial film cannot resist the stress, and consequently, cracks occur in the film to reduce the stress. Hence, it is considered that the residual stress causes cracks in the epitaxial film.

FIG. 2 suggests that when distortion caused by the stress is not exhibited in a (1 1–2 0) ZnO film which is epitaxially grown on the R-plane sapphire substrate when the interplanar spacing between the (1 1–2 0) planes of the ZnO is 1.6247 Å. As the interplanar spacing deviates from 1.6247 Å, the integration width of the X-ray diffraction peak increases; hence, the crystallinity of the ZnO film deteriorates. When the interplanar spacing between the ZnO crystal planes is 1.6247 Å, that is, when the ZnO film is in a bulk state, which means the film is not subjected to stress, the ZnO film exhibits superior piezoelectric characteristics. As the interplanar spacing deviates from this value, the piezoelectric characteristics deteriorate. It is disclosed in the literature that when a ZnO epitaxial film is formed on a sapphire substrate, the interplanar spacing between the ZnO crystal planes generally increase to 1.630 Å because the distance between Al atoms in the sapphire substrate is shorter than the distance between Zn atoms. Accordingly, the piezoelectric characteristics of the ZnO film can be maintained at the same level as in the bulk-state ZnO film in the present invention by epitaxially growing the ZnO film, under the specific conditions shown in Table 1, such that the (1 1–2 0) planes of the ZnO epitaxial film are disposed with an interplanar spacing of about 1.627 Å or less,. Also, FIG. 2 suggests that an interplanar spacing less than 1.623 Å is liable to cause cracks in the ZnO film and that the piezoelectric characteristics of the ZnO film deteriorate from the level in the bulk-state ZnO film.

Accordingly, a high-quality, practical ZnO epitaxial film having excellent crystallinity and no cracks can be achieved by setting the interplanar spacing in the range of about 1.623 Å to 1.627 Å.

Figure 5:
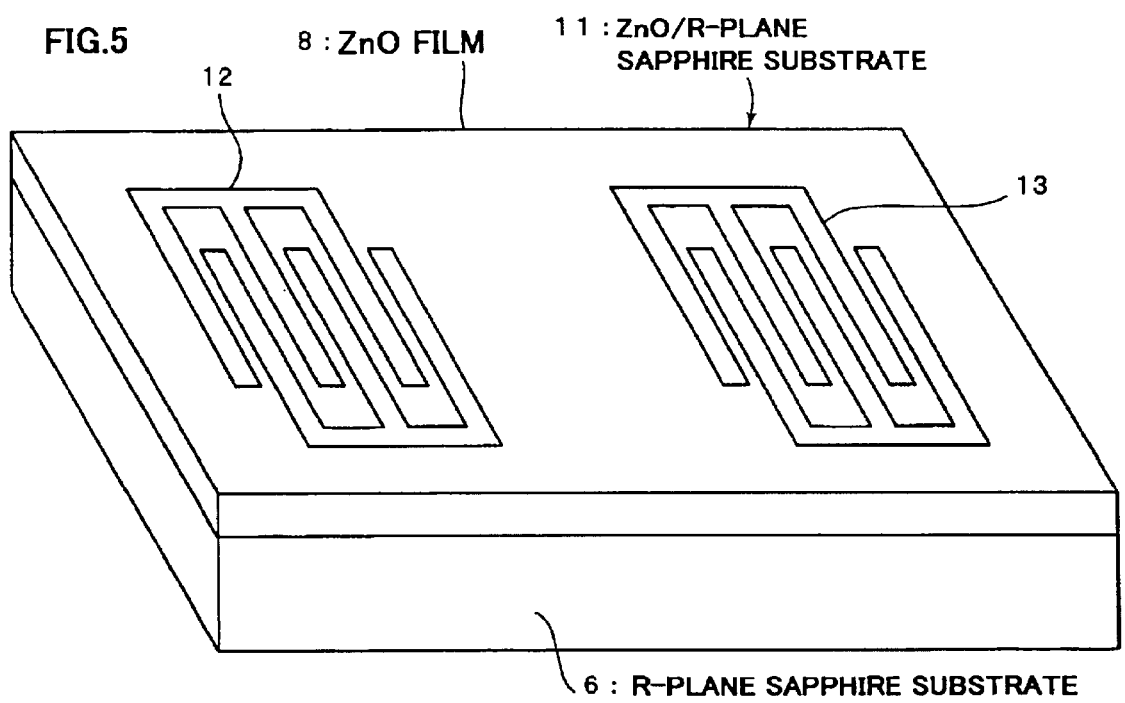
FIG. 5 is a perspective view of a surface acoustic wave device using a ZnO/sapphire substrate according to the present invention.

FIG. 5 shows a surface acoustic wave device using the ZnO/sapphire substrate according to the embodiment of the present invention. FIG. 5 is a schematic plan view of a surface acoustic wave device, serving as a transverse surface acoustic wave filter, comprising a ZnO/sapphire substrate 11 and interdigital transducers (IDTs) 12 and 13 on the ZnO/sapphire substrate 11. Devices using the ZnO/sapphire substrate 11 are not limited to the above-described surface acoustic wave device, but it may be used for surface acoustic wave devices having various structures, semiconductor devices, optical devices and the like.

In the ZnO/sapphire substrate of the present invention, a ZnO epitaxial film is formed on an R-plane sapphire substrate whose (0 1–1 2) crystal planes are parallel to the surface thereof. The (1 1–2 0) planes of the ZnO film are disposed with an interplanar spacing d in the range of about 1.623 Å to 1.627 Å, parallel to the (0 1–1 2) planes of the sapphire. The ZnO epitaxial film, therefore, can have excellent crystallinity and cracks do not occur in the ZnO film. By using the ZnO/sapphire substrate, devices which have excellent characteristics and maintain the characteristics can be achieved.

According to the method for manufacturing the ZnO/sapphire substrate of the present invention, an R-plane sapphire substrate whose (0 1–1 2) crystal planes are parallel to the surface thereof is prepared, and then a ZnO film is epitaxially formed on the R-plane sapphire substrate such that the (1 1–2 0) planes of the ZnO are disposed with an interplanar spacing in the range of about 1.623 Å to 1.627 Å parallel to the (0 1–1 2) planes of the sapphire. The resulting ZnO/sapphire substrate, therefore, can have a ZnO epitaxial film having excellent crystallinity in which cracks do not occur.

The surface acoustic wave device of the present invention has at least one IDT on the ZnO/sapphire substrate. Since the ZnO film of the ZnO/sapphire substrate has excellent crystallinity and cracks do not occur in the ZnO film, the quality of the surface acoustic wave device can be maintained.

What is claimed is:

1. A ZnO/sapphire substrate comprising:

an R-plane sapphire substrate whose (0 1–1 2) crystal planes are parallel to the surface thereof; and a ZnO epitaxial film on the R-plane sapphire substrate, (1 1–2 0) crystal planes of the ZnO epitaxial film being parallel to the (0 1–1 2) crystal planes of the R-plane sapphire substrate, and an interplanar spacing of (1 1–2 0) crystal planes of the ZnO epitaxial film being in the range of about 1.623 Å to 1.627 Å.

2. The ZnO/sapphire substrate as set forth in claim 1 in combination with at least one interdigital transducer.

3. A method for manufacturing a ZnO/sapphire substrate, comprising the steps of:

providing an R-plane sapphire substrate whose (0 1–1 2) crystal planes are parallel to the surface thereof; and epitaxially growing a ZnO film on the R-plane sapphire substrate such that (1 1–2 0) crystal planes of the ZnO epitaxial film are parallel to the (0 1–1 2) crystal planes of the R-plane sapphire substrate and the interplanar spacing of (1 1–2 0) crystal planes of the ZnO epitaxial film is the range of about 1.623 Å to 1.627 Å.

4. A method for manufacturing a ZnO/sapphire substrate as set forth in claim 3, further comprising preparing the R-plane sapphire substrate whose (0 1–1 2) crystal planes are parallel to the surface thereof.

* * * * *